(12) United States Patent
Parrish et al.

(10) Patent No.: US 8,193,005 B1
(45) Date of Patent: Jun. 5, 2012

(54) MEMS PROCESS METHOD FOR HIGH ASPECT RATIO STRUCTURES

(75) Inventors: Charles J. Parrish, Milton, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/966,397

(22) Filed: Dec. 13, 2010

(51) Int. Cl.
 *H01L 21/00* (2006.01)
 *H01L 21/311* (2006.01)
 *H01L 21/302* (2006.01)
 *H01L 21/461* (2006.01)

(52) U.S. Cl. .............................. 438/7; 438/700; 438/717
(58) Field of Classification Search .............. 438/7, 700, 438/717; 257/E51.529
 See application file for complete search history.

(56) References Cited

U.S. PATENT DOCUMENTS

| | | | |
|---|---|---|---|
| 6,245,581 B1 | 6/2001 | Bonser et al. | |
| 6,562,639 B1 * | 5/2003 | Minvielle et al. | 438/14 |
| 6,625,497 B2 | 9/2003 | Fairbairn et al. | |
| 7,483,804 B2 * | 1/2009 | Scheer | 702/127 |
| 2003/0106642 A1 | 6/2003 | Fairbairn et al. | |
| 2007/0178699 A1 | 8/2007 | Schaller et al. | |
| 2008/0254627 A1 * | 10/2008 | Wells | 438/689 |

OTHER PUBLICATIONS

Photolithography article: http://en.wikipedia.org/wiki/Photolithography.*
Photolithography article//en.wikipedia.org/wiki'Photolithography; Oct. 4, 2011. This paper was sent in the Final Rejection. The date is listed here.*
Taylor, et al., "Characterizing and Predicting Spatial Nonuniformity in the Deep Reactive Ion Etching of Silicon", Journal of the Electrochemical Society, 153 (8) (2006), pp. C575-0585.
Merz, et al., "Impact of Si Drie on Vibratory MEMS Gyroscope Performance", Transducers & Eurosensors, The 14th International Conference on Solid-State Sensors, Actuators and Microsystems, Lyon, France, Jun. 10-14, 2007, pp. 1187-1190.
Ivo W. Rangelow, "Critical tasks in high aspect ratio silicon dry etching for microelectromechanical systems", J. Vac. Sci. Technol. A 21(4), Jul./Aug. 2003, pp. 1550-1562.

* cited by examiner

*Primary Examiner* — William M. Brewster
(74) *Attorney, Agent, or Firm* — Wood, Herron & Evans, LLP; Anthony J. Canale

(57) ABSTRACT

Methods for the controlled manufacture of high aspect ratio features. The method may include forming a layer stack on a top surface of a substrate and forming features in the layers of the layer stack. The high aspect ratio features may be defined using a resist layer that is patterned with a photolithographic condition. After removing at least one of the layers removed from the top of the layer stack, a feature dimension may be measured for features at different locations on the substrate. The method may further include changing the photolithographic condition based on the measured dimension and processing another substrate using the changed photolithographic condition.

18 Claims, 8 Drawing Sheets

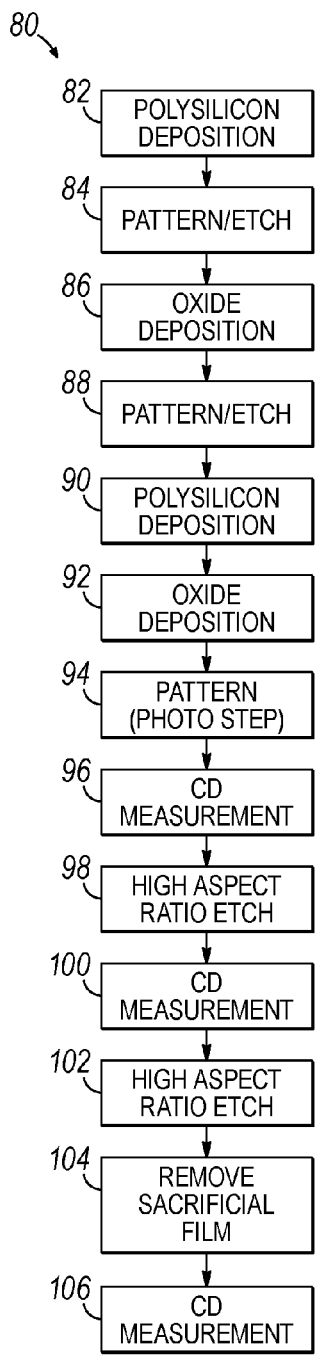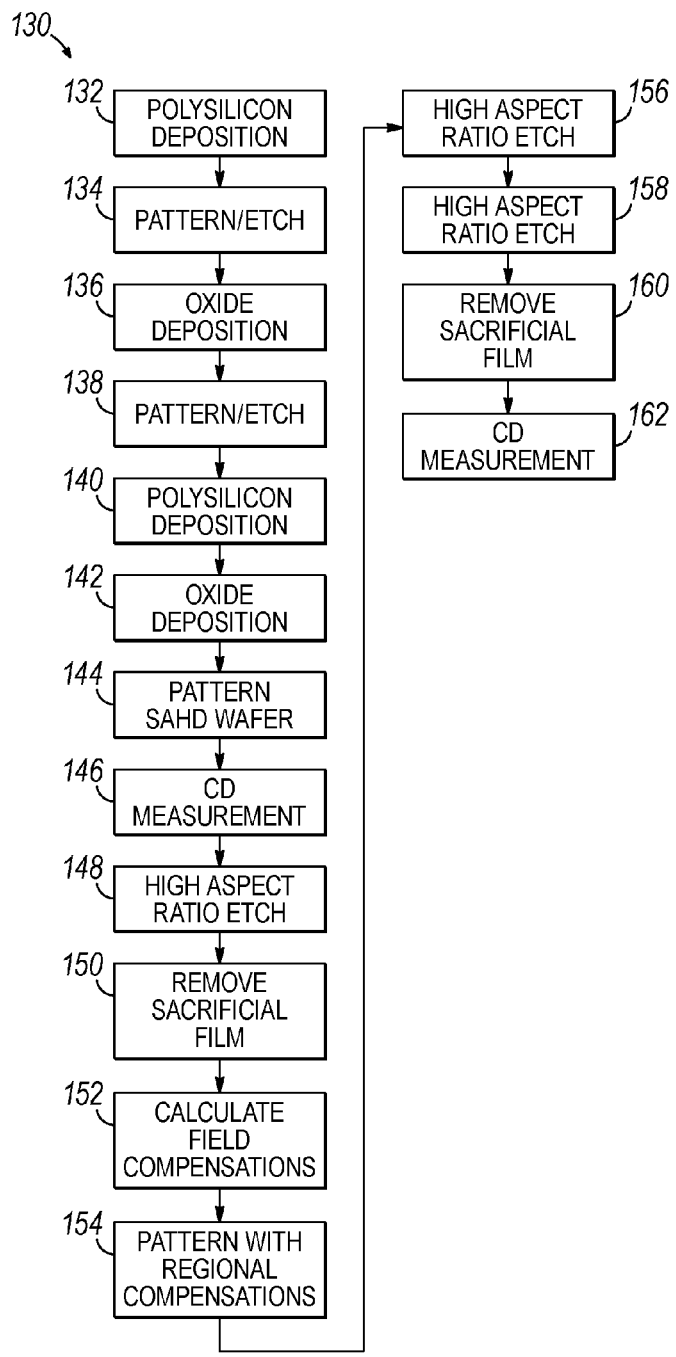
FIG. 5
FIG. 7

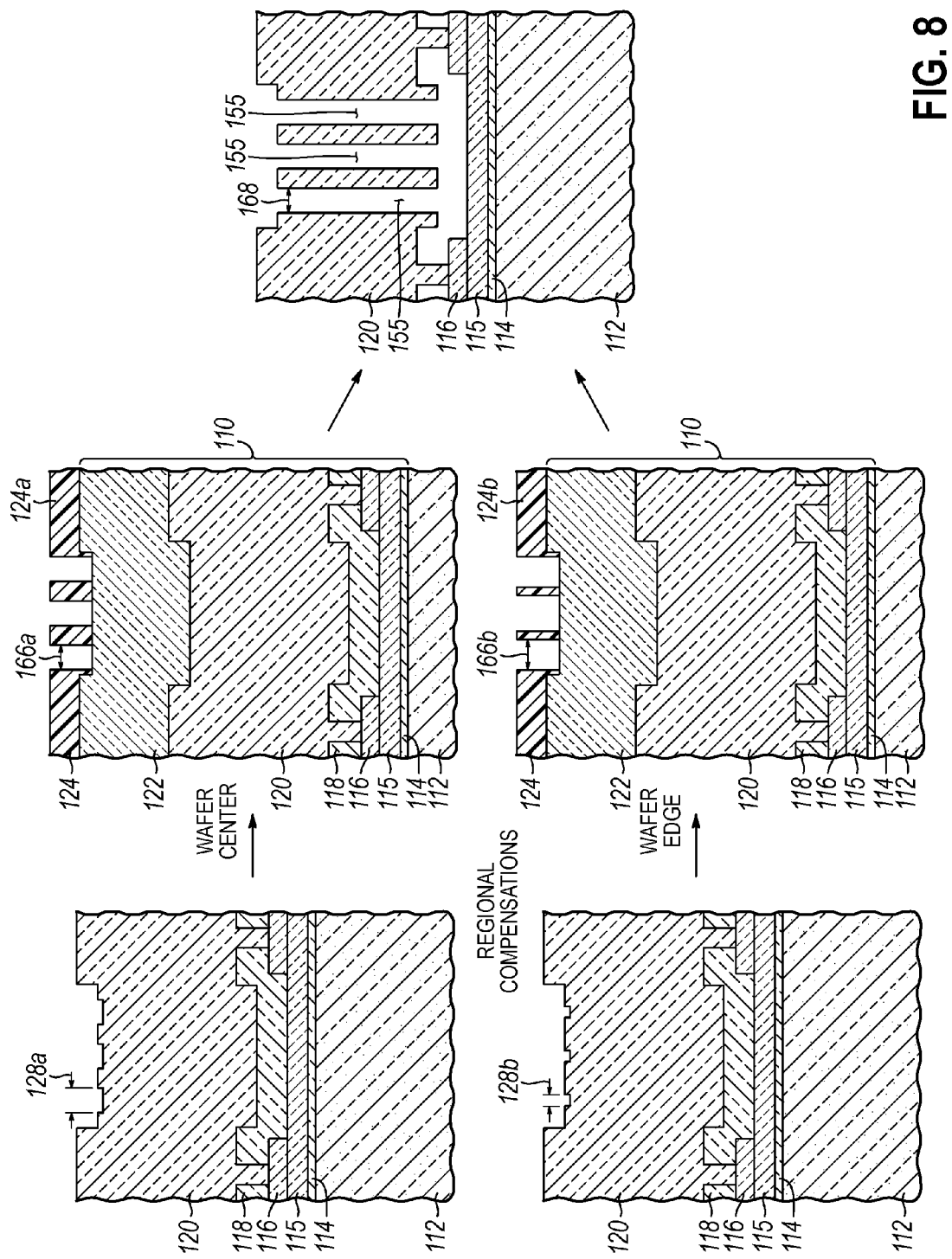

MEMS PROCESS METHOD FOR HIGH ASPECT RATIO STRUCTURES

BACKGROUND

The present invention relates to semiconductor device fabrication, and more specifically, to the fabrication of high aspect ratio structures.

Micro-electro-mechanical system (MEMS) manufacturing often requires the fabrication of high aspect ratio structures. One of the primary challenges in MEMS manufacturing is the ability to etch uniform high aspect ratio structures across a substrate surface. For example, profile asymmetries as low as 10 nm have been observed to produce unacceptable device performance in a MEMS gyroscope element. Etch non-uniformities may exhibit an aspect ratio dependence, a micro-loading or pattern density dependence, an across-substrate dependence, or an etch chamber dependence.

Critical dimension features near the bottom portion of the high aspect ratio structures are difficult to measure with an in-line critical dimension (CD) scanning electron microscope (SEM) because shadowing of the primary electron beam occurs beyond a certain depth at a given feature aspect ratio. While dimensions of the top portion of the high aspect ratio structures can be readily measured using an SEM, the dimensions of the bottom portion of the high aspect ratio structures is arguably more important. Specifically, the bottom portion of the high aspect ratio structures determines the feature size uniformity of subsequently etched features if the high aspect ratio structures are used as a hardmask, or the device performance depends on the original high aspect ratio structures. An inaccurately measured critical dimension influenced by the depth of the high aspect ratio structures may produce errors if used to adjust either the photolithography process or a subsequent etching process.

Therefore, there is a need for processing methods that improve the dimensional uniformity of high aspect ratio structures.

BRIEF SUMMARY

In an embodiment, a method may include forming a plurality of layers on a top surface of a first substrate and forming a plurality of features extending through at least one of the plurality of layers. The features may be defined using a resist layer patterned with a photolithographic condition. At least one of the layers may be removed and, in response to removing at least one of the layers, a feature dimension may be measured for features at different locations on the first substrate. The method may further include changing the photolithographic condition based on the measured dimension and processing a second substrate using the changed photolithographic condition.

BRIEF DESCRIPTION OF THE SEVERAL VIEWS OF THE DRAWINGS

The accompanying drawings, which are incorporated in and constitute a part of this specification, illustrate embodiments of the invention and, together with a general description of the invention given above, and the detailed description given below, serve to explain the invention.

FIG. 5 is a flow diagram of a conventional surface high aspect ratio etch process.

FIG. 7 is a flow diagram of a surface high aspect ratio etch process consistent with embodiments of the invention.

FIG. 8 illustrates a series of cross-sectional views at different points during the etch process of FIG. 7 and at different locations on the substrate during the high aspect ratio etches.

DETAILED DESCRIPTION

Embodiments of the invention assist in preventing feature size variation, such as CD variation, across a wafer or substrate during a high-aspect-ratio etching process. Feedback from a reference standard may be used to assist in fabricating high aspect ratio structures with uniform feature dimensions across the substrate surface in a manufacturing environment, which may include multiple product designs and multiple etching platforms.

Figure 1:
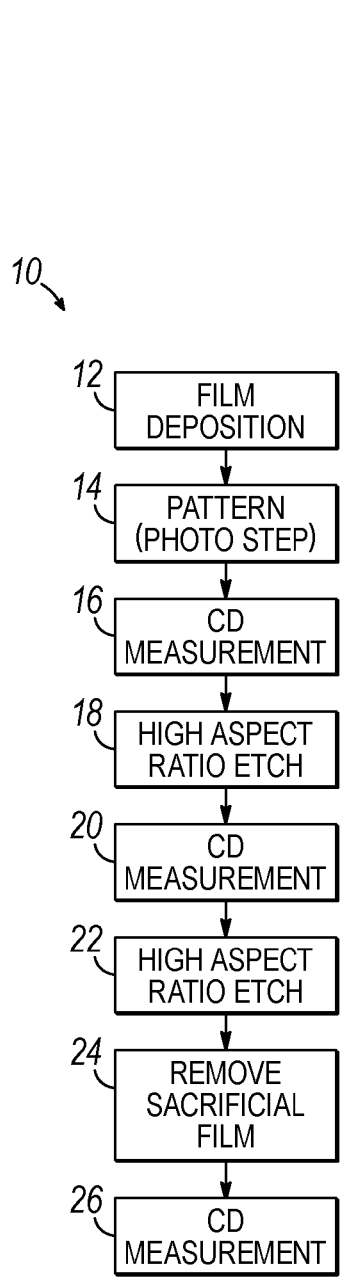
FIG. 1 is a flow diagram of a conventional high aspect ratio etch process.
Figure 2:
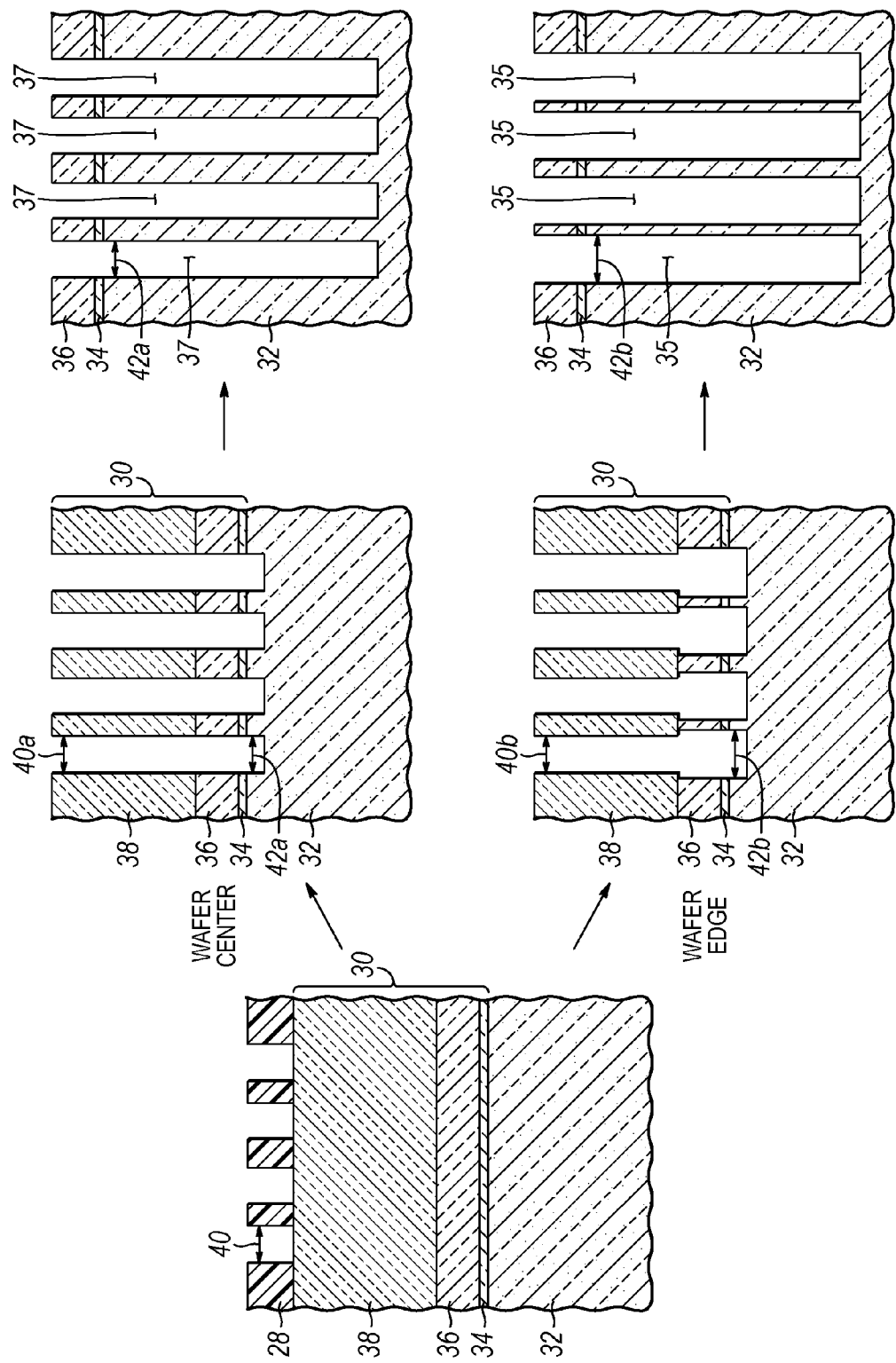
FIG. 2 illustrates a series of cross-sectional views at different points during the etch process of FIG. 1 and at different locations on the substrate during the high aspect ratio etches.

With reference to the flow diagram 10 in FIG. 1 and the cross-sectional views of FIG. 2, a conventional method for the fabrication of features in the form of high aspect ratio structures is described for comparative purposes. At block 12, a layer stack 30 is formed that may include a pad layer 34 of oxide ($SiO_2$), a pad layer 36 of silicon nitride ($Si_3N_4$), and one or more sacrificial films 38 formed on a top surface of a wafer or substrate 32. One of ordinary skill in the art will recognize that other materials and additional or fewer layers may be used depending on the requirements of the final fabricated device.

The substrate 32 may be comprised of any material that a person having ordinary skill in the art would recognize as suitable for use in fabricating a MEMS structure or another type of structure with high aspect ratio features. The substrate 32 may be comprised of silicon (Si), silicon-germanium (SiGe), a III-V substrate such as gallium arsenide (GaAs), sapphire, or another type of material, or a layered substrate such as silicon-on-insulator (SOI), that. In a representative embodiment, the substrate 32 may be comprised of a bulk silicon wafer.

The materials constituting the pad oxide layer 34, pad nitride layer 36, and sacrificial film 38 are chosen to etch selectively to (i.e., at a higher etch rate than) the semiconductor material constituting the substrate 32 and to also be readily removed at a subsequent fabrication stage. In one embodiment, sacrificial film 38 may be comprised of $SiO_2$ deposited, for example, by a chemical vapor deposition (CVD) process. The pad oxide layer 34, which is thinner than the pad nitride layer 36 and sacrificial film 38, may be formed by a wet or dry thermal oxidation process. The pad nitride layer 36 may be deposited by, for example, a CVD process.

At block 14, a resist film 28, which is used to pattern the layer stack 30, is formed on a top surface of the one or more sacrificial films 38 by applying a resist coating and using a photolithography process to pattern the resist coating. The photolithography process entails exposing the resist film 28, which is comprised of a radiation-sensitive sacrificial organic material, to radiation imaged through a photomask and developing the resultant latent feature pattern in the exposed resist to define openings or windows at the intended locations of high aspect ratio structures. The windows in the resist film 28 extend to the top surface of the one or more sacrificial films 38.

At block 16, a dimension 40, for example a critical dimension (CD), of the windows in the resist film 28 may be measured as indicated in the left hand panel of FIG. 2 using a scanning electron microscope (SEM) (e.g., an in-line critical dimension scanning electron microscope (CDSEM)) or another suitable metrology tool. The critical dimension, also known as the minimum feature size, represents the dimensions of the smallest geometrical features, in this case a width of the high aspect ratio structures, that can be formed during semiconductor device/circuit manufacturing using given technology. The measurement process may be limited to assess only those windows having a critical dimension.

At block 18, a first high aspect ratio etch occurs through the sacrificial film 38, pad nitride layer 36, and pad oxide layer 34 to form initial high aspect ratio structures in the layer stack 30 at the locations of the windows in the patterned resist film 28. The patterned layer stack 30 will function as a hardmask for subsequently etching the high aspect ratio structures into the substrate 32. The first high aspect ratio etch may over-etch to a shallow depth into the semiconductor material of the substrate 32. The feature pattern may be transferred from the patterned resist film 28 to the layer stack 30 by an anisotropic dry etch process, such as a reactive-ion etching (RIE) process. The resist film 28 is removed by ashing or chemical stripping.

At block 20, an SEM may be used to measure a dimension 40a of the layer stack 30 near the center of the substrate 32 and a dimension 40b of the layer stack 30 near a peripheral edge of the substrate 32 as indicated in the central panel of FIG. 2. The measurement process may be restricted to measuring dimensions 40a, 40b that are critical dimensions. While the measurable dimensions 40a and 40b may be within an acceptable tolerance for the process flow, the dimensions 42a and 42b near the base or bottom of the features in the hardmask at the center and edge of the substrate 32, respectively, may differ and may not be within an acceptable tolerance. This variation may be due to, for example, material variations, variations in the process equipment, or potentially other process variations. Because of the high aspect ratio of the windows in the layer stack 30, the SEM cannot measure the dimensions 42a, 42b.

At block 22, a second high aspect ratio etch is performed that uses the patterned layer stack 30 as a hardmask. At the locations of the windows in the patterned layer stack 30, the second high aspect ratio etch forms features in substrate 32 having the form of high aspect ratio structures 35, 37, as apparent in the right hand panel of FIG. 2. In the representative embodiment, the high aspect ratio structures 35, 37 are openings with sidewalls extending into substrate 32. The second high aspect ratio etch may be executed using any suitable conventional anisotropic etch process, such as deep reactive ion etching (e.g., DRIE), capable of producing substantially vertical trench sidewalls. Areas of the substrate 32 masked by the patterned layer stack 30 are protected during the second high aspect ratio etch.

A representative DRIE process for forming the high aspect ratio structures 35, 37 is a Bosch etch process characterized by a very high etching rate for silicon, vertical sidewalls, a high aspect ratio, and a high selectivity to oxide. According to the Bosch etch process, the anisotropic etching process alternates repeatedly between cycles of etching and passivation to achieve nearly vertical structures. During the vertical etching step, a plasma generated from a source gas, such as $SF_6$, is used to etch the material of the substrate 32. During the passivation step, a plasma generated from a source gas, such as $C_4F_8$, coats the sidewalls of the high aspect ratio structures 35, 37 with a chemically inert passivation layer. The passivation layer helps prevent lateral etching of the sidewalls during the vertical etching step of a subsequent cycle. The etch/coat steps are repeated many times over resulting in a large number of very small isotropic etch steps occurring only at the bottom of the etched high aspect ratio structures 35, 37.

Alternatively, another DRIE process for forming the high aspect ratio structures 35, 37 concurrently uses a sulfur hexafluoride ($SF_6$) plasma to etch and a $HBr/Cl_2/O_2$, $HBr/O_2$, or $Cl_2/O_2$ chemistry plasma to passivate the sidewalls.

At block 24 and after the high aspect ratio structures 35, 37 are formed by the second high aspect ratio etch, the sacrificial film 38 is removed to expose the pad nitride layer 36. The sacrificial film 38 may be removed utilizing a conventional wet chemical stripping process, such as substrate immersion in a solution containing a mixture of hydrofluoric and sulfuric acids. At block 26, a SEM is employed to actually measure the dimension 42a of high aspect ratio structures 37 at or near the center of the substrate 32 and the dimension 42b at or near the peripheral edge of the substrate 32. Because of etch non-uniformity across the substrate 32 in the conventional process flow, the dimensions 42a, 42b of the high aspect ratio structures 35, 37 may differ as apparent in the right hand panel of FIG. 2. This dimensional difference may be significant enough that the high aspect ratio structures 35, 37 produced by the second high aspect ratio etch are out of an acceptable tolerance. When the second high aspect ratio etch is performed, the unmeasured dimensions 42a, 42b are transferred by the etching process to the high aspect ratio structures 35, 37.

To assist in avoiding the variation of the feature dimensions across the substrate 32 resulting from the conventional process flow, embodiments of the invention employ a feedback method to assist in fabricating uniform high aspect ratio structures across the substrate 32 surface in a manufacturing environment, which also may include multiple product designs and multiple etch platforms. Exemplary embodiments related to both bulk silicon MEMS structures, such as the structure in FIGS. 1 and 2 above, as well as surface MEMS structures explained in more detail later.

In accordance with an embodiment of the invention, a sacrificial substrate may be used to assess the uniformity of the first high aspect ratio etch. After the first high aspect ratio etch is performed, all or a portion of the hardmask is removed to reveal the etched features. A dimension of these features is measured, for example with an in-line SEM. The information from the measurements on the partially etched sacrificial substrate may then be fed back to the photolithography process. Subsequently processed substrates may be regionally compensated with reliance upon the feedback from the sacrificial substrate. This method may also apply to high aspect ratio structures formed using more than two sequential etch processes, as will be understood by one of ordinary skill in the art.

Figure 3:
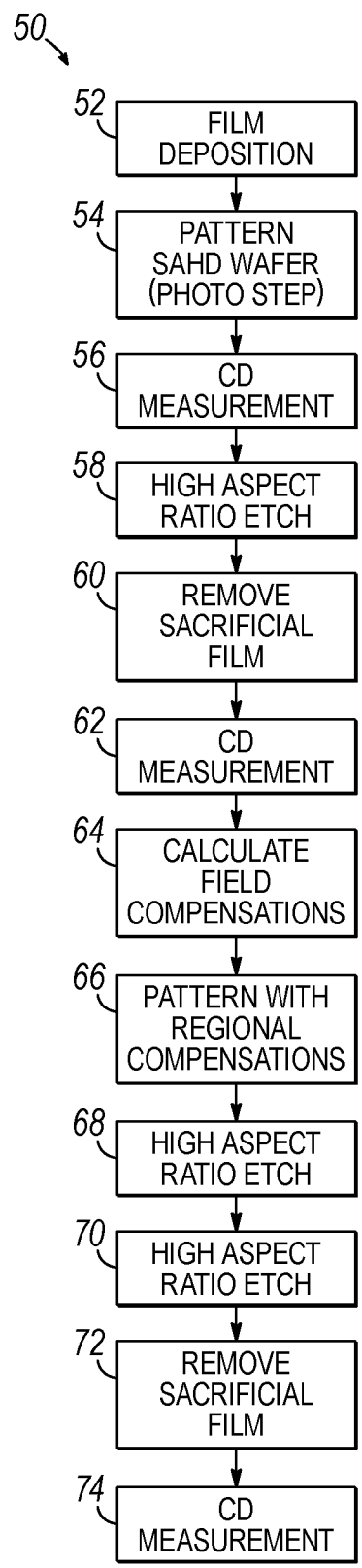
FIG. 3 is a flow diagram of a high aspect ratio etch process consistent with embodiments of the invention.
Figure 4:
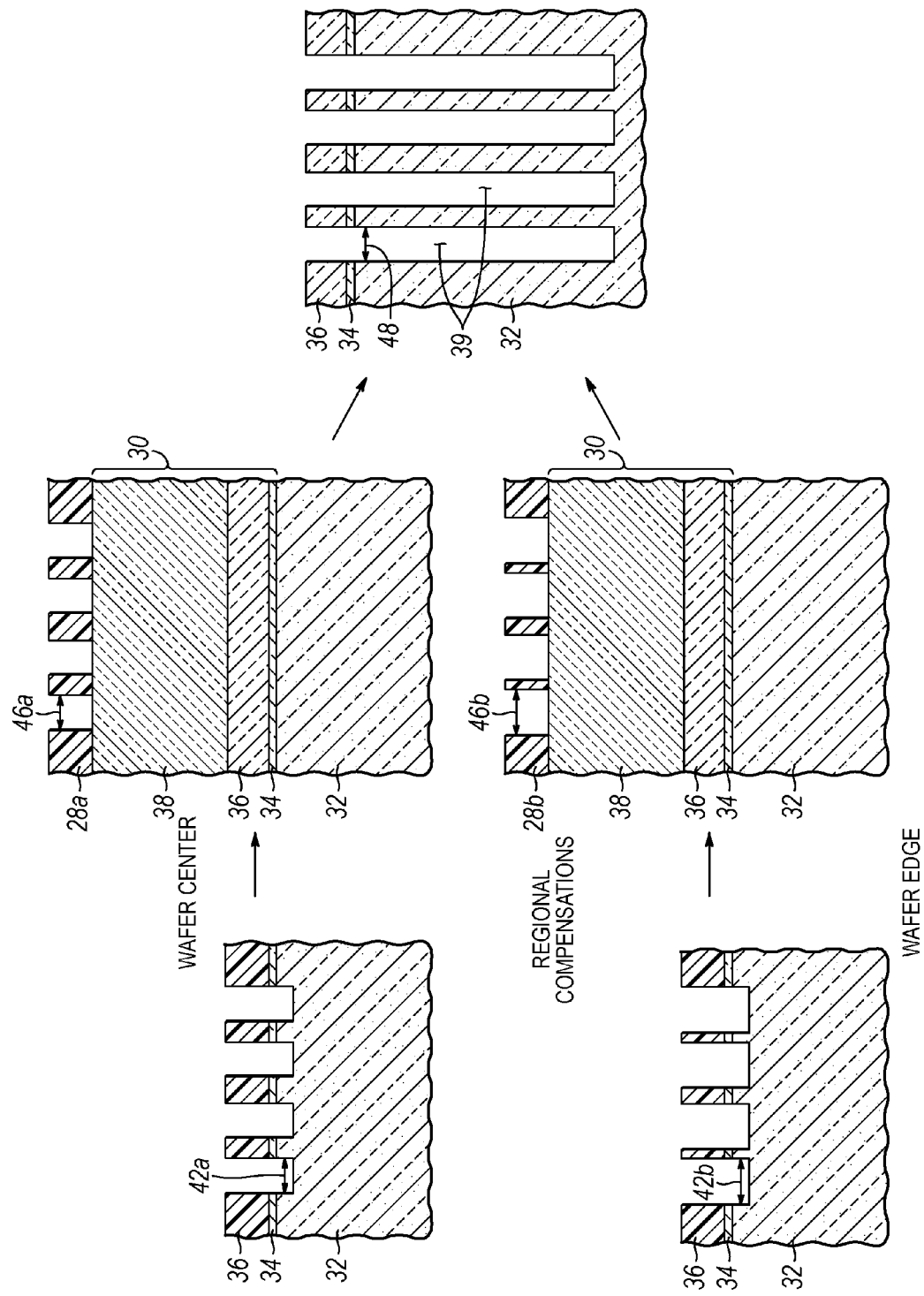
FIG. 4 illustrates a series of cross-sectional views at different points during the etch process of FIG. 3 and at different locations on the substrate during the high aspect ratio etches.

With reference to FIGS. 3, 4 in which like reference numerals refer to like features in FIGS. 1, 2 and in accordance with an embodiment of the invention, the resist film 28 is spin coated onto layer stack 30 at block 52 in the flow diagram 50. At block 54, the resist film 28 is patterned using a set of photolithographic conditions in the lithography tool. At block 56, after the pattern has been developed, the SEM is used to measure one or more dimensions, such as critical dimensions, of the windows in the resist film 28 at several preset locations, such as near the center of the substrate 32 and near the peripheral edge of the substrate 32.

At block 58, the first high aspect ratio etch is executed that patterns the layer stack 30 with an over-etch condition that etches to a shallow depth into the semiconductor material of the substrate 32. At this point, at block 60, the process flow is interrupted and the resist film 28 and the sacrificial film 38 are removed. The resist film 28 may be removed by ashing or chemical stripping. The sacrificial film 38 may be removed utilizing a conventional wet chemical stripping process, such as immersion in an etchant containing a mixture of hydrofluoric and sulfuric acids if the sacrificial film 38 is comprised of $SiO_2$.

At block 62, the SEM is used to measure the dimensions 42a, 42b near the center of the substrate 32 and near the peripheral edge of the substrate 32 as apparent in the left hand panel of FIG. 4. The removal of the intervening sacrificial film 38 permits the measurement of the dimensions 42a, 42b as the electron shadowing effects of the patterned hardmask are essentially eliminated. The measurement process may be restricted to measuring dimensions 42a, 42b that are critical dimensions.

The measured dimensions 42a, 42b of the etched features are evaluated and, for example, may be compared with the dimensions 40 of the corresponding windows in the resist film 28. Based upon the evaluation, field compensations for the photolithographical patterning of the resist film 28 are calculated in block 64. The field compensations are attributed to the etch process and given a spatial correlation with location across the substrate 32. The field compensations may be implemented by adjustments or modulations of the one or more of the photolithographic conditions (e.g., radiation dose) of the radiation (e.g., light or UV radiation) used during the photolithography process patterning the resist film 28. The field compensations may be contained in a look-up table or may be formula-based. The field compensations contain correlation data or curves that provide correction data for the photolithography process based upon the measured dimensions 42a, 42b.

At block 66, the feedback from the sacrificial substrate is implemented in the patterned resist film 28 formed on subsequently processed substrates 32. The resist pattern includes regional compensations for one or more of the photolithographic conditions in the lithography tool based upon the field compensations derived from the sacrificial substrate. As a result of the information contained in the feedback, the feature size in the portion of the resist film 28a near the substrate center (dimension 46a) may be different than the feature size in the portion of the resist film 28b near the substrate peripheral edge (dimension 46b) as apparent in the central panel of FIG. 4.

The first and second high aspect ratio etches are conducted at blocks 68 and 70 to form high aspect ratio features 39 as visible in the right hand panel of FIG. 4. Each of the high aspect ratio structures 39 has a depth and a width that contribute to an aspect ratio, which may be defined as the ratio of depth to width of a feature. The high aspect ratio structures 39 may have a depth-to-width ratio in a range of 10:1 to 50:1 or higher.

At block 72, the sacrificial film 38 is removed. The SEM is used to measure the dimension 48 of the high aspect ratio features 39 at one or more locations across the substrate 32 at block 74. As a result of the regional compensations made to the photolithography process forming the pattern in resist film 28, dimension 48 is more uniform across the substrate 32.

While the above described process flow applies to fabrication requiring micromachining of a bulk substrate, the principles of the embodiments of the invention also apply to a different application, namely surface micromachining.

For comparative purposes, a conventional surface micromachining process flow is presented below with reference to FIGS. 5 and 6. Beginning with the flow diagram 80 in FIG. 5 and with reference to the structural cross-sections of FIG. 6, blocks 82-92 provide a conventional process flow to create a layered structure 110 with high aspect ratio etching. At block 82, a first layer 116 of polycrystalline silicon (polysilicon) is deposited on a silicon substrate 112 covered by a pad oxide layer 114 and a pad nitride layer 115. The polysilicon in the first polysilicon layer 116 may be deposited using a known deposition process, such as physical vapor deposition (PVD) or CVD.

At block 84, the first polysilicon layer 116 is patterned and etched to impart a desired configuration. The first polysilicon layer 116 may be patterned by applying a photoresist (not shown), exposing the photoresist using radiation imaged through a photomask, and then developing the exposed photoresist to provide an intended pattern to be formed in the first polysilicon layer 116. The pattern may be transferred from the photoresist into the first polysilicon layer 116 with a RIE process.

At block 86, a layer 118 of, for example, $SiO_2$ is deposited and also patterned to impart a desired configuration. At block 90, a second polysilicon layer 120 is deposited, followed by a sacrificial film 122 comprised of e.g., $SiO_2$ at block 92. One of ordinary skill in the art will realize that any number of deposition and pattern/etch steps may be performed to generate the appropriate structure for etching and that such structures are not limited to the exemplary structure provided in this example.

A resist film 124 may be deposited on the layer stack 164 and patterned in a photolithography step at block 94. After the pattern has been developed, at block 96, a SEM may be used to measure a dimension 126, for example a critical dimension (CD), of the windows in the patterned resist film 124 at several locations across the substrate 112, as apparent in the left hand panel of FIG. 6.

At block 98, a first high aspect ratio etch is performed that produces features extending through, in this example, the sacrificial film 122 and slightly into the polysilicon layer 120. At block 100, feature dimensions 126a, 126b (which may be critical dimensions) are measured at several locations across the substrate 112. For example, a SEM may be used to measure the dimension 126a near the center of the substrate 112 and the dimension 126b near the peripheral edge of the substrate 112, as apparent in the central panel of FIG. 6. While the measured dimensions 126a, 126b may be within the proper tolerances, the dimensions 128a, 128b at the base or bottom of the features at the center and peripheral edge of the substrate 112, respectively, are not measurable with the SEM. The dimensions 128a, 128 may be non-uniform and outside of acceptable tolerances, and this out-of-tolerance condition may be unknown at this stage of the process flow in the flow diagram 80. The dimensional variation may be due to variations in the material, variations in the process equipment, or other process variations.

A second high aspect ratio etch is performed at block 102 to form features in the representative form of high aspect ratio structures 129, 131 and the sacrificial film 118 is removed at block 104. At block 106, the SEM is used to determine the respective dimensions 128a, 128b, which may be critical dimensions, of the high aspect ratio structures 129, 131 as apparent in the right hand panel of FIG. 6. The dimension 128a of high aspect ratio structure 129, which is measured near the center of the substrate 112, may differ from the dimension 128b of high aspect ratio structure 131 measured near the peripheral edge of the substrate 112. The difference in the dimensions 128a, 128b may be out of an acceptable tolerance range as a result of etching non-uniformity across the substrate 112.

Figure 6:
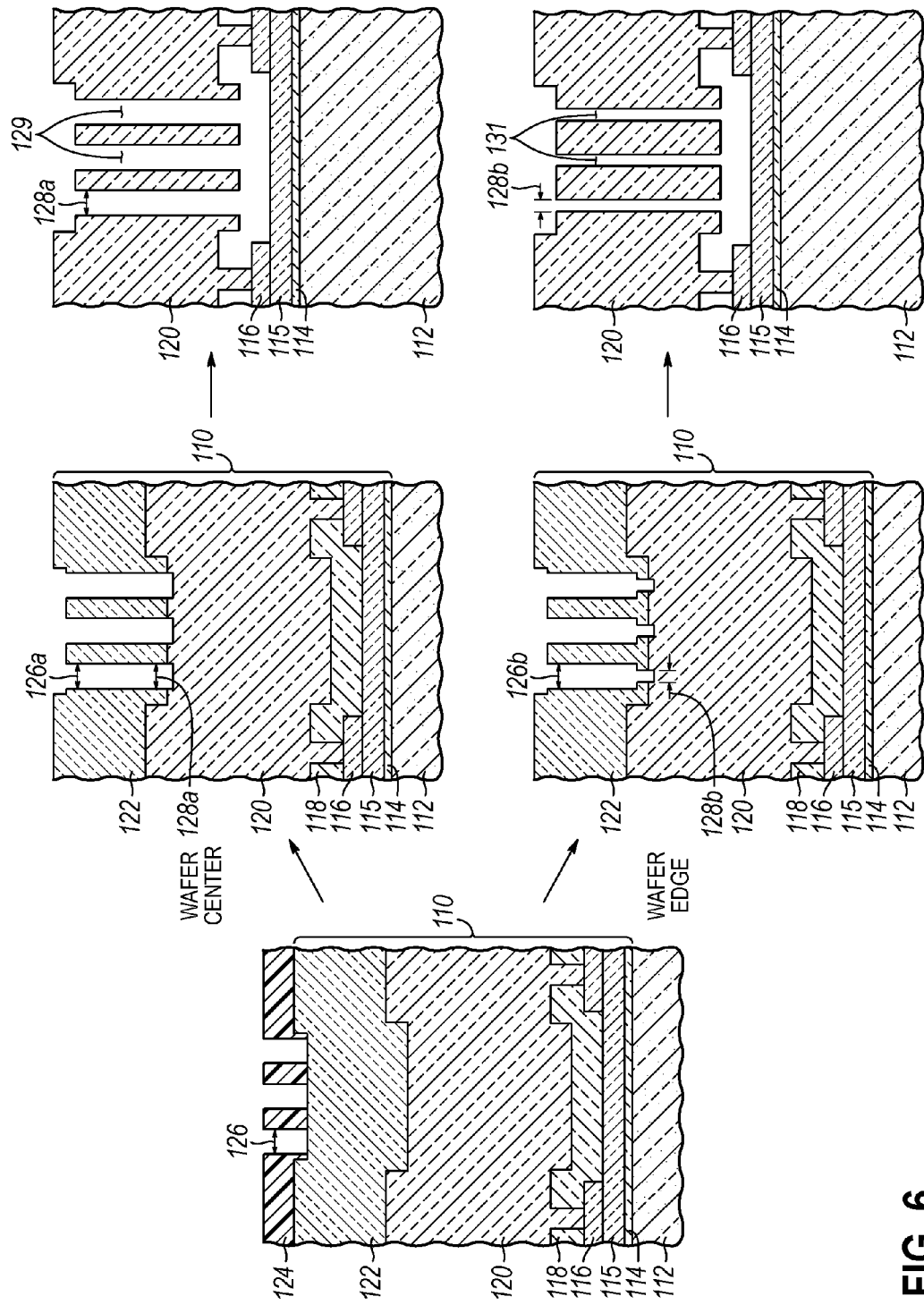
FIG. 6 illustrates a series of cross-sectional views at different points during the etch process of FIG. 5 and at different locations on the substrate during the high aspect ratio etches.

With reference to FIGS. 7, 8 in which like reference numerals refer to like features in FIGS. 5, 6 and in accordance with an embodiment of the invention, the different layers in the layer stack of the layered structure 110 are applied to substrate 112 and patterned at blocks 132-142 in the flow diagram 130 as described above with regard to flow diagram 80 (FIG. 5). At block 144, a resist film (not shown) is applied and patterned to define windows at the intended locations for the high aspect ratio structures. After the pattern has been formed in the resist film, at block 146, an SEM is used to measure a dimension (e.g. a critical dimension) for the resist windows at several locations across the substrate 112.

At block 148, a first high aspect ratio etch similar to the first high aspect ratio etch described above (FIGS. 5, 6) is executed that patterns the sacrificial film 122 of the layered structure 110 with an over-etch condition that etches to a shallow depth into the polysilicon layer 120, as apparent in the left hand panel of FIG. 8. At this point, at block 150, the process flow is interrupted and the resist film and the sacrificial film 122 is removed. The resist film may be removed by ashing or chemical stripping. The sacrificial film 122 may be removed utilizing a conventional wet chemical stripping process, such as immersion in an etchant containing a mixture of hydrofluoric and sulfuric acids if the sacrificial film 122 is comprised of $SiO_2$.

At block 152, the SEM is used to measure the dimensions 128a, 128b of features in polysilicon layer near the center of the substrate 112 and near the peripheral edge of the substrate 112 as apparent in the left hand panel of FIG. 8. The removal of the intervening sacrificial film 122 permits the measurement of the dimensions 128a, 128b as the electron shadowing effects of the patterned hardmask are essentially eliminated. The measurement process may be restricted to measuring dimensions 128a, 128b of the features in the polysilicon layer 120 that are critical dimensions.

The measured dimensions 128a, 128b of the etched features are evaluated and, for example, may be compared with the dimensions of the corresponding windows in the resist film. Based upon the evaluation, field compensations for the photolithographical patterning of the resist film are calculated in block 152. The field compensations are attributed to the etch process and given a spatial correlation with location across the substrate 112. The field compensations may be implemented by adjustments or modulations of the one or more of the photolithographic conditions (e.g., radiation dose) of the radiation (e.g., light or UV radiation) used during the photolithography process patterning the resist film. The field compensations may be contained in a look-up table or may be formula-based. The field compensations contain correlation data or curves that provide correction data for the photolithography process based upon the measured dimensions 128a, 128b.

At block 154, a pattern is formed in the resist film 124 deposited on substrate 112, which may be a production substrate. The pattern includes regional compensations for one or more of the photolithographic conditions in the lithography tool based upon the field compensations from the sacrificial substrate 112 such that the feature dimension 166a in the resist film 124 near the substrate center is different than the feature dimension 166b in the resist film 28 near the substrate peripheral edge.

At block 154, these patterns are developed in the resist film 124 that is deposited on production substrates 112. The two-stage high aspect ratio etch occurs at blocks 156 and 158 to provide high aspect ratio structures 155, which are features represented by openings with sidewalls extending into the polysilicon layer 120. The sacrificial film 122 is removed at block 160. The CD 168 is measured at block 162, which, due to the compensations made to the photolithographic film patterns, may now be more uniform across the production substrate 112.

At block 154, the feedback from the sacrificial substrate is implemented in the patterned resist film 124 formed on subsequently processed substrates 112. The resist pattern includes regional compensations for one or more of the photolithographic conditions in the lithography tool based upon the field compensations derived from the sacrificial substrate. As a result of the information contained in the feedback, the feature size in portion of the resist film 124a near the substrate center (dimension 166a) may be different than the feature size in the portion of the resist film 124b near the substrate peripheral edge (dimension 166b) as apparent in the central panel of FIG. 8.

The first and second high aspect ratio etches are conducted at blocks 156 and 158 to form high aspect ratio features 155 as visible in the right hand panel of FIG. 8. The high aspect ratio structures 155 are features represented by openings with sidewalls extending into the polysilicon layer 120. Each of the high aspect ratio structures 155 has a depth and a width that contribute to an aspect ratio, which is defined as the ratio of depth to width of a feature. The high aspect ratio structures 155 may have a depth-to-width ratio is a range of 10:1 to 50:1 or higher.

At block 160, the sacrificial film 122 is removed. The SEM is used to measure the dimension 168 (e.g., a critical dimension) of the high aspect ratio features 155 at one or more locations across the substrate 112 at block 162. As a result of the regional compensations made to the photolithography process forming the pattern in resist film 124, dimension 168 is more uniform across the substrate 32.

Figure 9:
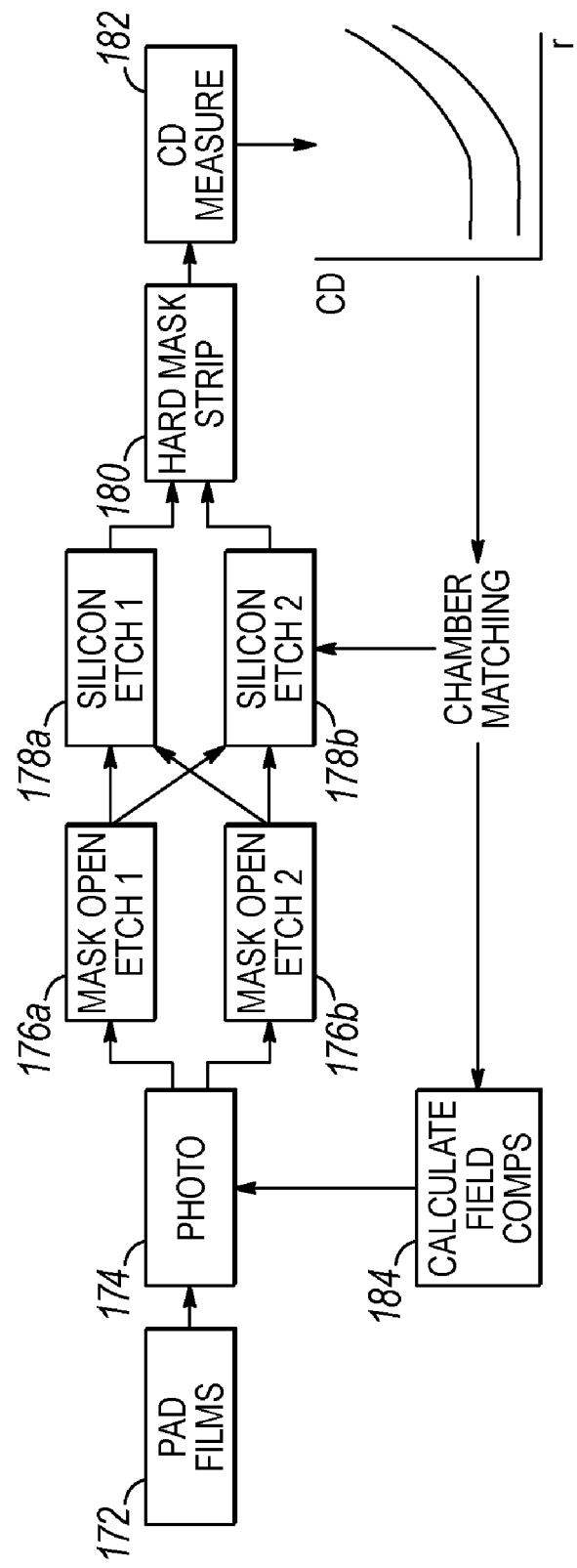
FIG. 9 is a block diagram of a multi-chamber configuration for a conventional high aspect ratio etch process.

The feedback process may also be applied to compensate for etch variations when multiple etch chambers are used. For example, and as illustrated in the block diagram in FIG. 9, a substrate 112 to be processed has a hardmask comprised of, for example, oxide and nitride pad films and/or a thicker sacrificial film applied at block 172. A photo step occurs at block 174 to provide an appropriately patterned resist layer for a mask open etch. At this point, the substrate 112 may be etched in either of the plasma etching chambers 176a or 176b. Furthermore, after the initial mask open etch in one of the etch chambers 176a, 176b, the substrate 112 may be subsequently etched in either plasma etching chambers 178a or 178b with this subsequent plasma etching chamber not necessarily corresponding to the previous chamber 176a, 176b. The hardmask may be stripped in block 180 and critical dimension measurements acquired in block 182.

The critical dimension for any combination of Etch 1 in etch chambers 176a, 176b and Etch 2 in etch chambers 178a and 178b should be approximately equivalent. However, the equivalency may be compromised if because of process mismatches between etch chambers 176a, 176b. There is no way of identifying which path that a particular substrate took during the two stage etch (block 176a→block 178a; block 176a→block 178b; block 176b→block 178b; block 176b→block 178a). Any compensation calculated in block 184 is applied back at the photo step in block 174. The feedback may assist in improving the critical dimension uniformity across the substrate 112, but as mentioned above, may not optimize the processing due to potential critical dimension variations originating from the mask open etch that are convolved in the critical dimension measurement and not easily extricable. Additionally, while the etch chamber parameters may be adjusted to assist in maintaining critical dimension matching, these changes are actually compensating for changes at both the substrate (e.g., silicon) etch and mask open etch, so variability may be high and thereby cause more frequent changes to the etch process parameters.

Figure 10:
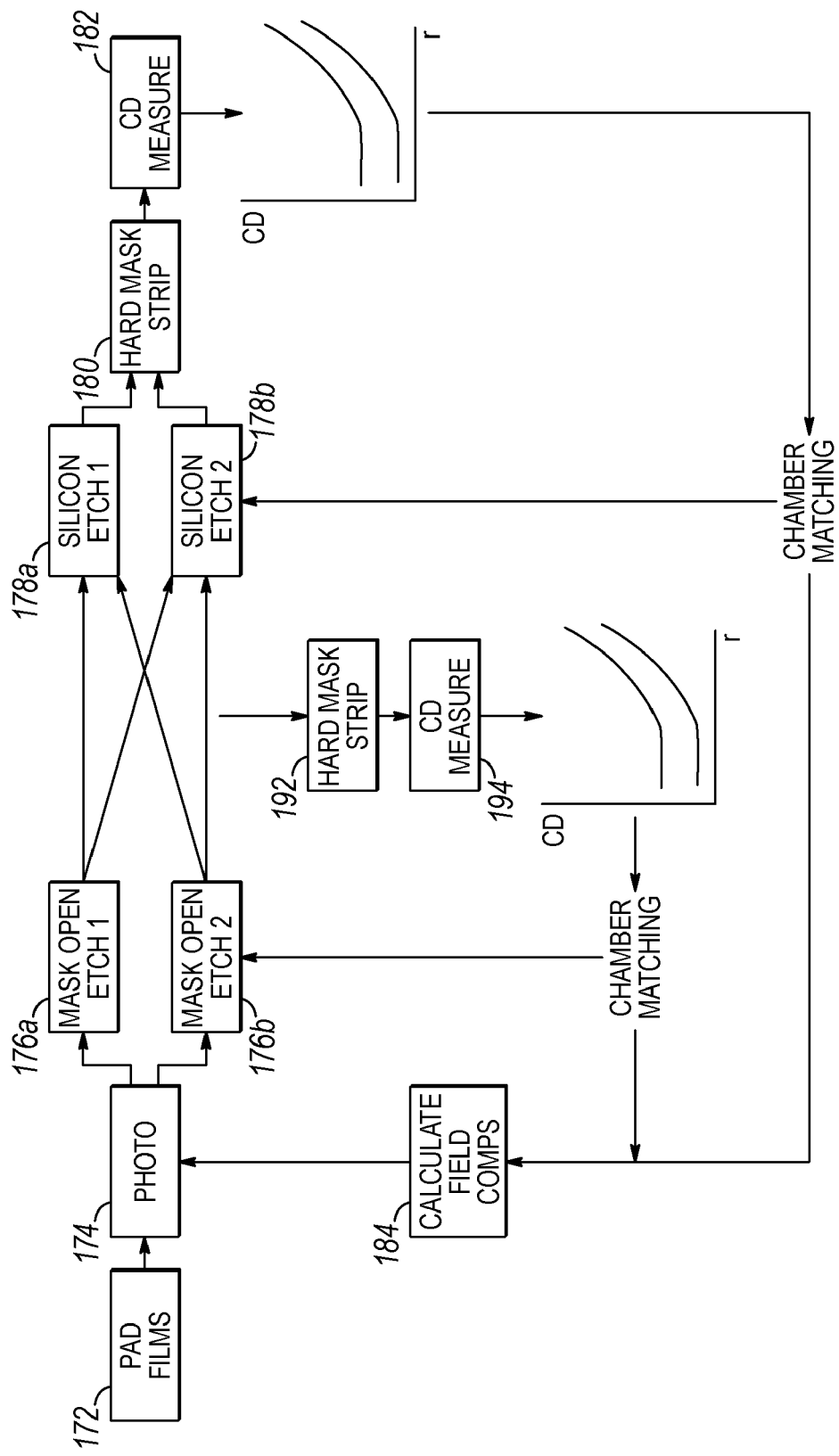
FIG. 10 is a block diagram of a multi-chamber configuration for a high aspect ratio etch process consistent with embodiments of the invention.

In order to improve critical dimension matching independent of the mask open etch and semiconductor etch path, and referring now to FIG. 10, a sacrificial substrate may be employed to measure and account for any variation after the mask open etch in block 176a, 176b. Similar to the process set out above, a sacrificial substrate has a hardmask consisting of pad films and/or a sacrificial film applied at block 172 and a photo step at block 174 in preparation for the mask open etch. At this point, the mask open etch of the sacrificial substrate may be performed in either chamber represented by block 176a or 176b. However, after the mask open etch, the hardmask is stripped or removed from the sacrificial substrate in block 192 and critical dimension measurements are taken at block 194. At this point, field compensations for the photolithography process (as described above) and chamber matching for the etch chambers 176a, 176b may be calculated at block 184 and applied at the photolithography step in block 174 as well as the mask open etch in etch chambers 176a, 176b.

Each of the etch chambers 176a, 176b is a conventional plasma etching system that further includes a plasma etch system controller, which operates the respective plasma etching system in accordance with a recipe control port and with reliance upon a process monitoring system. The plasma recipe represents a set of instructions containing process parameters for generating the plasma within the plasma chamber. Such plasma etching systems and the programming of plasma recipes are understood by a person having ordinary skill in the art.

The etch chambers 176a, 176b may be included in a larger group of plasma etching chambers of nominally equal construction and running the same process recipe on the same type of substrates 112. With use or following maintenance or chamber cleaning, the etching conditions of etch chambers 176a, 176b may change and the etch chambers 176a, 176b may become out of tune. Tuning the plasma recipes in the etch chambers 176a, 176b to restore a tuned match so that the process result is nominally uniform among the etch chambers 176a, 176b is known as chamber matching. The chamber matching adjusts the plasma recipes in each of the etch chambers 176a, 176b to reduce or correct inhomogeneities so that the critical dimension from the mask open etch is approximately equal, which to ensures process repeatability and control. Representative perturbed process parameters include, but are not limited, to source power, substrate bias, chamber pressure, and gas flow rates.

Once the inhomogeneities between the etch chambers 176a, 176b has been reduced, the process flow continues much like that of the process flow described above, where a production substrate to be processed has a hardmask applied at block 172 and the photo step at block 174. At this point, the substrate may be etched in either chamber represented by block 176a or 176b. After the initial etch, the substrate may be subsequently etched in either chamber represented by block 178a or 178b with this subsequent chamber again not necessarily corresponding to the previous chamber. The hardmask may be stripped in block 180 after the features are formed in the production substrate and critical dimension measurements taken in block 182.

Because compensations for the mask open etch have already been applied, the only compensations left are for chamber matching of the etch chambers 178a, 178b. Thus, after compensating for variations in the critical dimension measurements, the process is much more optimized than that of FIG. 9, and any subsequent substrates being processed should be more path independent without having the large critical dimension variations produced in the absence of compensating for differences between the etch chambers 176a, 176b.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   forming a plurality of layers comprising a hardmask on a top surface of a first substrate;
   forming a first plurality of high aspect ratio features extending through at least one of the layers, the first plurality of high aspect ratio features defined with an etching process using a first resist layer patterned with a photolithographic condition in a photolithography tool;
   removing at least one of the layers;
   in response to removing at least one of the layers, measuring a dimension of the first high aspect ratio features at different locations on the first substrate;
   changing the photolithographic condition in the photolithography tool based on the measured dimension; and
   processing a second substrate in the photolithography tool using the changed photolithographic condition,
   wherein processing the second substrate includes etching a second plurality of high aspect ratio features and measuring a dimension of the second plurality of high aspect ratio features.

2. The method of claim 1 further comprising:
   applying a second resist layer on a third substrate; and
   patterning the second resist layer in the photolithography tool using the changed photolithographic condition.

3. The method of claim 2 wherein the second resist layer is applied on a plurality of layers on the third substrate, and further comprising:

etching a plurality of third features extending through the layers on the third substrate and into the third substrate.

4. The method of claim 3 wherein the third features are high aspect ratio structures each with sidewalls that extend into the third substrate.

5. The method of claim 2 wherein the second resist layer is applied to a plurality of layers on the third substrate, and further comprising:

etching a plurality of third features extending through at least one of the layers on the third substrate.

6. The method of claim 5 further comprising:

removing at least one of the layers using the third features as an access path for an etchant.

7. The method of claim 5 wherein the third features are high aspect ratio structures each with sidewalls that extend through the one or more of the layers but not into the third substrate.

8. The method of claim 2 wherein the changed photolithographic condition is a change in a dose of radiation used to pattern the second resist layer in comparison with the first resist layer.

9. The method of claim 1 wherein the first plurality of high aspect ratio features are formed using a process recipe in a first etch chamber, and each of the first plurality of high aspect ratio extend through the layers features to a shallow depth into the first substrate.

10. The method of claim 9 wherein removing at least one of the layers comprises:

removing the hardmask.

11. The method of claim 9 further comprising:

changing at least one process parameter for the process recipe used by the first etch chamber based on the measured dimension for the first plurality of high aspect ratio features.

12. The method of claim 10 further comprising:

forming a plurality of layers comprising a hardmask on a top surface of a third substrate;

forming a third plurality of high aspect ratio features extending through the layers on the third substrate to a shallow depth into the third substrate using the etch recipe in a second etch chamber;

removing the hardmask;

in response to removing the hardmask, measuring a dimension of each of the third plurality of high aspect ratio features at the shallow depth in the third substrate; and changing at least one process parameter of the process recipe for the second etch chamber based on the measured dimension for the third plurality of high aspect ratio features.

13. The method of claim 12 wherein the at least one process parameter of the process recipe for the first etch chamber and the at least one process parameter of the process recipe for the second etch chamber are changed to minimize a difference between the measured dimension of each of the first plurality of high aspect ratio features at the shallow depth in the first substrate and the measured dimension of each of the third plurality of high aspect ratio features at the shallow depth in the third substrate so that the first etch chamber is matched to the second etch chamber.

14. The method of claim 1 wherein the measured dimension is a critical dimension.

15. The method of claim 1 wherein measuring the dimension of the first high aspect ratio features at different locations on the first substrate comprises:

measuring the dimension of at least one of the first high aspect ratio features near the center of the first substrate; and measuring the dimension of at least one of the first high aspect ratio features near a peripheral edge of the first substrate.

16. The method of claim 1 wherein measuring the dimension of the first high aspect ratio features at different locations on the first substrate comprises:

assessing the dimension of the first high aspect ratio features by imaging with a secondary electron microscopy.

17. The method of claim 1 the further comprising:

processing a third substrate with the changed photolithographic condition in the photolithography tool to perform bulk micromachining of a micro-electro-mechanical systems device.

18. The method of claim 1 further comprising:

processing a third substrate with the changed photolithographic condition in the photolithography tool to perform surface micromachining of a micro-electro-mechanical systems device.

* * * * *